(12) United States Patent
Hendrickson

(10) Patent No.: US 8,516,181 B1
(45) Date of Patent: Aug. 20, 2013

(54) MEMORY DEVICES HAVING DATA FLOW PIPELINING

(75) Inventor: Nicholas Thomas Hendrickson, Rancho Cordova, CA (US)

(73) Assignee: Micron Technology, Inc., Boise, ID (US)

( * ) Notice: Subject to any disclaimer, the term of this patent is extended or adjusted under 35 U.S.C. 154(b) by 604 days.

(21) Appl. No.: 12/415,973

(22) Filed: Mar. 31, 2009

(51) Int. Cl.
*G06F 12/02* (2006.01)

(52) U.S. Cl.
USPC ............ 711/103; 711/154; 711/167; 711/168

(58) Field of Classification Search
USPC .................................. 711/103, 154, 167, 168
See application file for complete search history.

(56) References Cited

U.S. PATENT DOCUMENTS

| 4,594,659 | A* | 6/1986 | Guenthner et al. ........... 712/207 |
| 2006/0171233 | A1* | 8/2006 | Fekih-Romdhane et al. ........................ 365/230.03 |
| 2007/0183178 | A1* | 8/2007 | Nishiyama et al. ............. 365/49 |
| 2008/0198671 | A1* | 8/2008 | Wang et al. ............... 365/189.05 |
| 2009/0037652 | A1* | 2/2009 | Yu et al. ........................ 711/103 |

* cited by examiner

*Primary Examiner* — Yong Choe
(74) *Attorney, Agent, or Firm* — Schwegman, Lundberg & Woessner, P.A.

(57) ABSTRACT

A memory device having a pipeline monitor and control block to issue a memory pipeline with process flows specific to NVM operation to optimize system performance.

8 Claims, 2 Drawing Sheets

MEMORY DEVICES HAVING DATA FLOW PIPELINING

Today's processors employ a technique called pipelining to execute more software program instructions per unit of time. In general, processor execution of an instruction involves fetching the instruction (e.g., from a memory system), decoding the instruction, obtaining needed operands, using the operands to perform an operation specified by the instruction, and saving a result. What is needed is a pipeline specific to memory devices.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
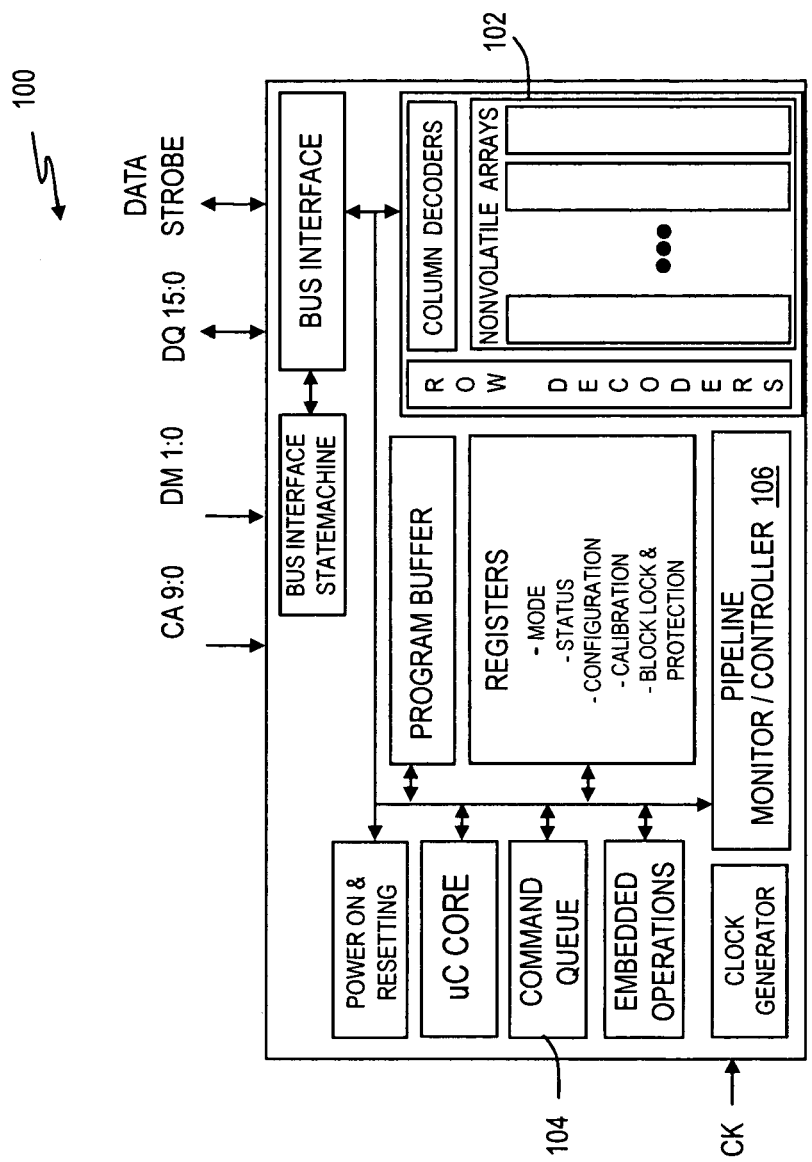
FIG. 1 illustrates a Nonvolatile Memory (NVM) device that incorporates the memory pipeline monitor/adjustor in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

FIG. 1 illustrates an exemplary embodiment of a nonvolatile memory device 100 that has a multiple bank architecture to provide flexibility for splitting the code and data spaces within memory arrays 102. In this embodiment memory arrays 102 are Phase Change Memory (PCM) arrays, also referred to as Phase-Change Random Access Memory (PRAM or PCRAM), Ovonic Unified Memory (OUM) or Chalcogenide Random Access Memory (C-RAM). In alternative embodiments the memory arrays 102 may be Flash arrays using charge trapping to differentiate between two stable states, Magnetic Random Access Memory (MRAM) arrays using a magnetic field to provide biasing toward a binary state, or Ferroelectric Random Access Memory (FRAM) arrays using a bi-stable atom that is shifted to form two stable polarization states.

Traditional processor based pipeline techniques internally organize semi-independent work from separate processes into stages that are linked into a 'chain', with one stage's output becoming another stages input until the process is complete. The separate processes stem from issued instructions in the performance of specific application algorithms. Thus, a processor pipeline may includes stages such as, for example, instruction fetch, instruction decode, instruction execute, memory access, and register write-back, among others.

However, in contrast to the processor pipeline and in accordance with features of the present invention, a memory pipeline is presented that controls memory based data flows in a memory architecture. As such, the data flow processes in the memory pipeline may include processes such as decoding, level shifting, sensing, redundancy multiplexing, Error Correction Code (ECC) calculations, data multiplexing, data buffering, flight times, etc. By pipelining a data path to access a memory array, random accesses to data in the memory array may be optimized.

Referring to nonvolatile memory device 100, a command queue 104 is used to interpret a command set and control memory operations. In cooperation with the command queue, a pipeline monitor/controller block 106 verifies the operational timings and provides a more optimal timing for issuing the memory commands. The algorithm implemented by pipeline monitor/controller block 106 adjusts the memory pipeline such that the minimum back to back random access time is constrained by the largest, critical timing element which cannot be further broken down. Instructions that precede and follow the critical operation are either faster than the critical operation, or are able to run in parallel with other instructions. By way of example for nonvolatile memory device 100, the sensing operation is the largest critical timing element, and accordingly, the pipeline monitor/controller block 106 makes the sensing operation the fastest instruction rate for the memory pipeline.

Figure 2:
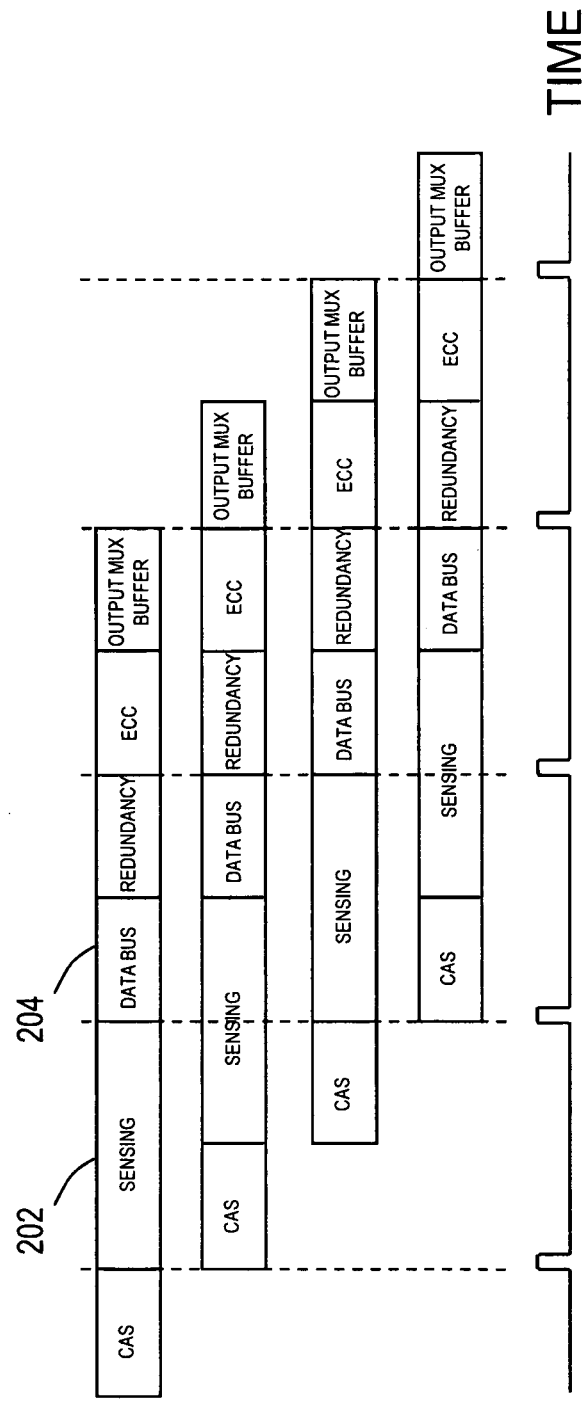
FIG. 2 illustrates pipelining a data path in a memory device in accordance with the present invention.

FIG. 2 illustrates one embodiment of a memory pipeline running in nonvolatile memory device 100 that controls bus transfers and memory operation; although the pipeline is exemplary and other pipeline snapshots would look different. The figure shows four data flows running concurrently that provide successive data access to the memory arrays 102, where sensing operation 202, data bus read 204, and the other operations in one memory pipeline are processed to prevent hardware conflicts with the processes executing in the other pipeline flows.

Command queue 104 establishes in advance which instructions are to be issued and determines a number of clock cycles for outputting valid data, and then pipeline monitor/controller block 106 adjusts the memory pipeline to account for the class of the instruction. For this example and as already mentioned, sensing operation 202 is determined to be a critical timing element, and as clearly shown in the figure, this instruction is given a full clock cycle for completion. However, the instructions 204 that follow the sensing operation are not critical and do not need a full clock cycle to execute, and therefore, pipeline monitor/controller block 106 recognizes these instructions as only needing one half of a clock cycle in the pipeline. Thus, pipeline monitor/controller block 106 receives the instructions to be issued, adjusts the memory pipeline to keep the largest critical timing element as the fastest issue rate in order to optimize system performance.

By now it should be apparent that embodiments of the present invention allow increased memory storage efficiencies and operation by using instruction characteristics to dynamically adjust the rate at which instructions are issued in the memory pipeline. By continually monitoring and shifting the rate at which instructions are issued, the computing system benefits. This memory pipelining can either be managed synchronously or asynchronously, and features of this invention are applicable to a variety of memory devices and modes of operation such as, for example, a Double-Data Rate (DDR2) system mode.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A nonvolatile memory device, comprising:
a memory array;
a multiple-bank architecture within the nonvolatile memory device to split code and data spaces within the memory array;
a memory-based pipelined data path having multiple steps, each of the multiple steps configured to be occupied simultaneously for providing unique instructions within the multiple-bank architecture; and
a pipeline controller located within the non-volatile memory device to control memory-based data flow through the memory-based pipelined data path to access the memory array, the pipeline controller configured to control the memory-based data flow either synchronously or asynchronously with respect to a master timer.

2. The nonvolatile memory device of claim 1, wherein a command queue establishes instructions to be issued and a corresponding number of clock cycles to output data for the instructions.

3. The nonvolatile memory device of claim 1, wherein a critical operation in the nonvolatile memory device is to be determined as a critical timing element that determines a fastest instruction rate for the pipeline.

4. The nonvolatile memory device of claim 3, wherein instructions that precede and follow the critical operation are either configured to run faster than the critical operation or are to run in parallel with other instructions.

5. The nonvolatile memory device of claim 1, wherein the device is a Phase-Change Memory (PCM) device.

6. The nonvolatile memory device of claim 1, wherein the device is a Magnetic Random Access Memory (MRAM) device.

7. The nonvolatile memory device of claim 1, wherein the device is a Ferroelectric Random Access Memory (FRAM) device.

8. The nonvolatile memory device of claim 1, wherein the device is a NOR Flash device.

* * * * *